United States Patent
Worley

(10) Patent No.: US 11,503,703 B2
(45) Date of Patent: Nov. 15, 2022

(54) APPARATUS, METHOD AND SYSTEM FOR A LIGHT FIXTURE DRIVING CIRCUIT

(71) Applicant: William F. Harris, Jr., Charlotte, NC (US)

(72) Inventor: Vincent Worley, Charlotte, NC (US)

(73) Assignee: William F. Harris, Jr., Charlotte, NC (US)

( * ) Notice: Subject to any disclaimer, the term of this patent is extended or adjusted under 35 U.S.C. 154(b) by 148 days.

(21) Appl. No.: 15/942,084

(22) Filed: Mar. 30, 2018

(65) Prior Publication Data

US 2019/0306950 A1 Oct. 3, 2019

(51) Int. Cl.
| | |
|---|---|
| *H05K 1/02* | (2006.01) |
| *H05K 1/18* | (2006.01) |
| *H05B 45/50* | (2022.01) |
| *H05B 45/382* | (2020.01) |
| *H02J 7/02* | (2016.01) |
| *H05B 45/54* | (2020.01) |

(52) U.S. Cl.
CPC ......... *H05K 1/0231* (2013.01); *H05B 45/382* (2020.01); *H05B 45/50* (2020.01); *H05K 1/18* (2013.01); *H02J 7/02* (2013.01); *H05B 45/54* (2020.01); *H05K 2201/10106* (2013.01)

(58) Field of Classification Search
None
See application file for complete search history.

(56) References Cited

U.S. PATENT DOCUMENTS

| | | | |
|---|---|---|---|
| 6,384,583 B1 | 5/2002 | Lestician | |
| 6,448,747 B1 | 9/2002 | Lestician | |
| 8,698,407 B1 * | 4/2014 | Chen ................. | H05B 33/0812 315/185 R |
| 2012/0280617 A1 * | 11/2012 | Josefowicz ........ | H05B 45/3725 315/85 |
| 2012/0286663 A1 * | 11/2012 | Puvanakijjakorn ......... | H05B 45/3575 315/85 |

(Continued)

OTHER PUBLICATIONS

Ron Lenk; Carol Lenk, "Practical AC Drive Circuitry For LEDs," in Practical Lighting Design with LEDs , IEEE, 2016, pp. 91-120, doi: 10.1002/9781119165347.ch8. (Year: 2016).*

(Continued)

*Primary Examiner* — Laura Yesildag
(74) *Attorney, Agent, or Firm* — Alston & Bird LLP

(57) ABSTRACT

An apparatus for powering a light-emitting diode (LED) is provided including: a circuit board having an input portion, a power portion, a protection portion, and an output portion; the input portion of the circuit board including an alternating current line and a neutral current line, where the alternating current received across the alternating current line and neutral line supply two distinct, alternative paths, where each of the two distinct alternative paths include a combination of capacitors, inductors, and rectifiers to mitigate signal noise; the power portion of the circuit configured to receive power from the input portion of the circuit along the two distinct, alternative paths, to regulate the current received from the two distinct, alternative paths, and to provide power to an LED driver; and the protection portion of the circuit may be configured to mitigate voltage surges and to regulate the voltage supplied to the LED driver.

17 Claims, 10 Drawing Sheets

(56) References Cited

U.S. PATENT DOCUMENTS

| | | | | |
|---|---|---|---|---|
| 2013/0271000 A1* | 10/2013 | Canter | ................. | H05B 45/375 |
| | | | | 315/53 |
| 2014/0300274 A1* | 10/2014 | Acatrinei | ........... | H05B 33/0815 |
| | | | | 315/85 |
| 2015/0312974 A1* | 10/2015 | Hu | ............................ | F21K 9/23 |
| | | | | 315/192 |
| 2015/0312983 A1* | 10/2015 | Hu | ............................ | F21V 3/00 |
| | | | | 315/186 |
| 2016/0043658 A1* | 2/2016 | Lopez | ................... | H02M 7/217 |
| | | | | 363/89 |
| 2016/0197468 A1 | 7/2016 | Bandel | | |
| 2016/0290623 A1* | 10/2016 | Harris, Jr | ................ | F21V 31/00 |
| 2017/0303353 A1* | 10/2017 | Guang | .................... | F21K 9/278 |
| 2018/0313896 A1* | 11/2018 | Liu | ........................ | H05B 47/24 |

OTHER PUBLICATIONS

R. Shalini, A. N. Nagashree and B. G. A. Murthy, "Uninterruptable power supply design using Float Cum Boost technology," 2016 IEEE International Conference on Power Electronics, Drives and Energy Systems (PEDES), 2016, pp. 1-6, doi: 10.1109/PEDES. 2016.7914230. (Year: 2016).*

\* cited by examiner

APPARATUS, METHOD AND SYSTEM FOR A LIGHT FIXTURE DRIVING CIRCUIT

FIELD OF THE INVENTION

Embodiments of the present invention generally relate to systems and methods for providing illumination and, more particularly, to an apparatus, method and system for a driving circuit for a luminaire, specifically a light emitting diode luminaire that is designed to comply with stringent military specifications and nautical requirements.

BACKGROUND OF THE INVENTION

Electric light sources exist in a variety of form factors from residential or commercial light fixtures to hand-held flashlights. Conventional incandescent light bulbs have given way to more efficient fluorescent light bulbs and compact florescent light (CFL) bulbs to provide substantially similar light while consuming less power. While a florescent light is more efficient than an equivalently bright incandescent light, light-emitting diodes (LEDs) are more efficient still at producing an equivalent light.

LEDs were initially relatively expensive as compared to incandescent or florescent lights, and were not suitable for many applications. Additionally, low intensity and limited color options for LEDs limited their usefulness. Recent developments in the field of LEDs have caused LED light sources to become ubiquitous replacements or supplements to conventional light sources. Further, LEDs may be packaged in considerably smaller form factors than equivalently bright incandescent lights or florescent lights.

As LEDs are substantially more energy efficient than their incandescent and florescent counterparts for producing the same amount of light, LED fixtures are becoming more common, particularly in environments where energy efficiency is critical, such as locations where power is not abundant or where electrical power consumption is costly. One such example are maritime embodiments. For example, it is important for light fixtures on sea-going vessels to be energy efficient and consume relatively low amounts of power. Further, maritime environments can be harsh, requiring additional considerations for the design of maritime light fixtures.

BRIEF SUMMARY

In light of the foregoing background, example embodiments of the present invention provide an improved apparatus, method and system for providing a driving circuit for a light fixture, particularly a driving circuit for a light emitting diode fixture for maritime applications. According to an example embodiment, an apparatus for powering a light-emitting diode (LED) is provided including: a circuit board having an input portion, a power portion, a protection portion, and an output portion; the input portion of the circuit board including an alternating current line and a neutral current line, where the alternating current received across the alternating current line and neutral line supply two distinct, alternative paths, where each of the two distinct alternative paths include a combination of capacitors, inductors, and rectifiers to mitigate signal noise; the power portion of the circuit configured to receive power from the input portion of the circuit along the two distinct, alternative paths, to regulate the current received from the two distinct, alternative paths, and to provide power to an LED driver; the protection portion of the circuit may be configured to mitigate voltage surges and to regulate the voltage supplied to the LED driver; and the output portion configured to receive power through the LED driver and to supply an LED with constant-current power.

According to some embodiments, the input portion may include a first rectifier and a second rectifier, where each of the first rectifier and the second rectifier convert alternating current received along a respective one of the two distinct, alternative paths to direct current. The power portion of the circuit may be configured to limit current based on a value established by a resistor positioned between a negative output terminal of at least one of the first rectifier and the second rectifier and a chassis ground of the apparatus. The direct current output of the first rectifier and the second rectifier may be connected, where the connected direct current outputs are supplied to the power portion of the circuit.

According to some embodiments, the protection portion of the circuit may be configured to limit voltage based on a value established by a plurality of resistors configured between the direct current of the power portion of the circuit and a chassis ground of the apparatus. The output portion of the circuit may include a positive output terminal and a negative output terminal, where an LED array is configured to be connected across the positive output terminal and the negative output terminal. Embodiments may include a resistor connected across the positive output terminal and the negative output terminal, where the resistor may prevent ghosting of the LED when power is removed from the input portion of the circuit board. The input portion, the power portion, the protection portion, and the output portion may each be positioned on a single circuit board. The input portion, the power portion, the protection portion, and the output portion may cooperate to meet or exceed military standard specification 461 (MIL-STD-461). The input portion, the power portion, the protection portion, and the output portion may cooperate to meet or exceed military standard specification 1399-300B (MIL-STD-1399-300B).

BRIEF DESCRIPTION OF THE DRAWINGS

Figure 1:
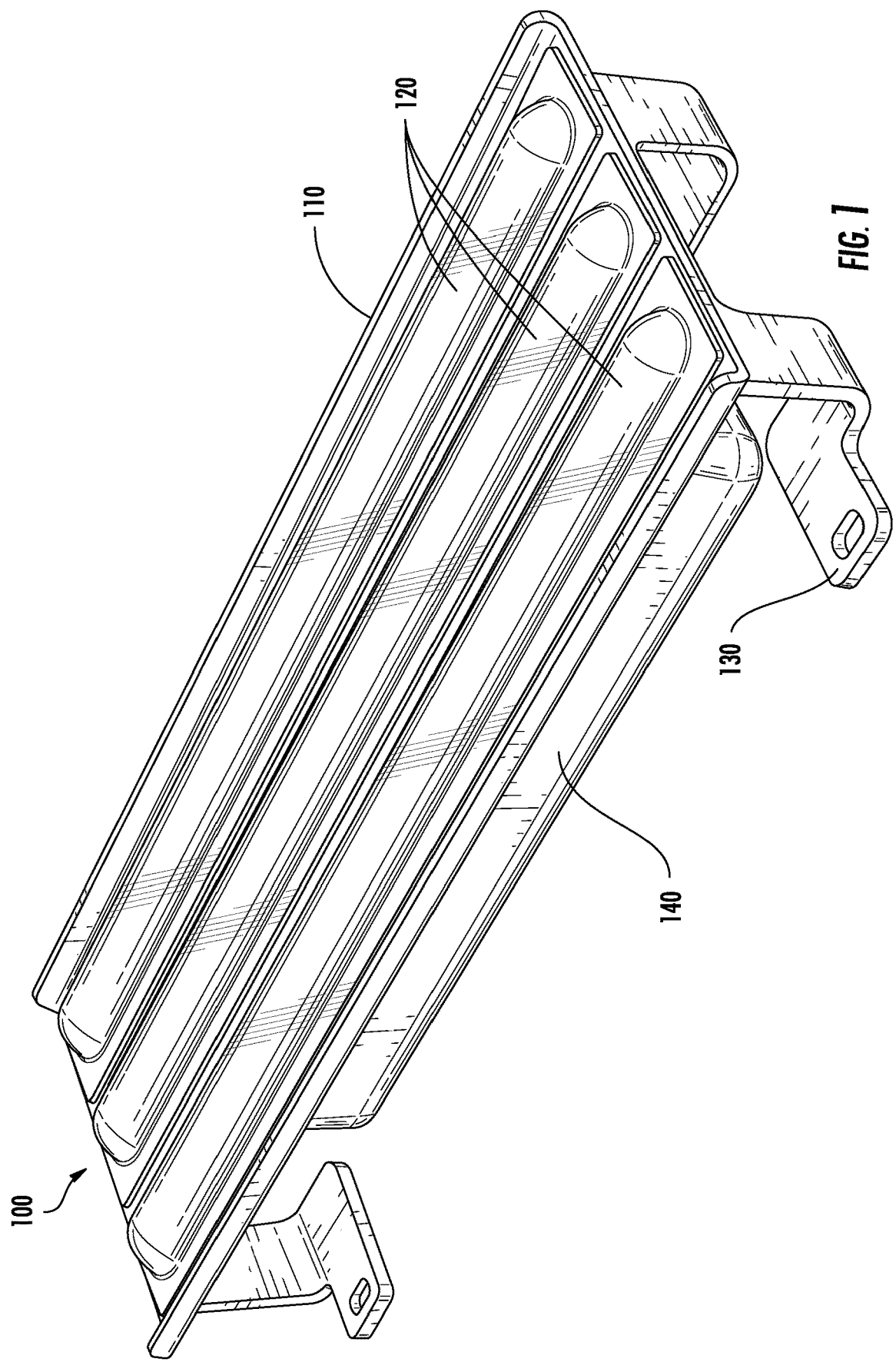
Figure 2:
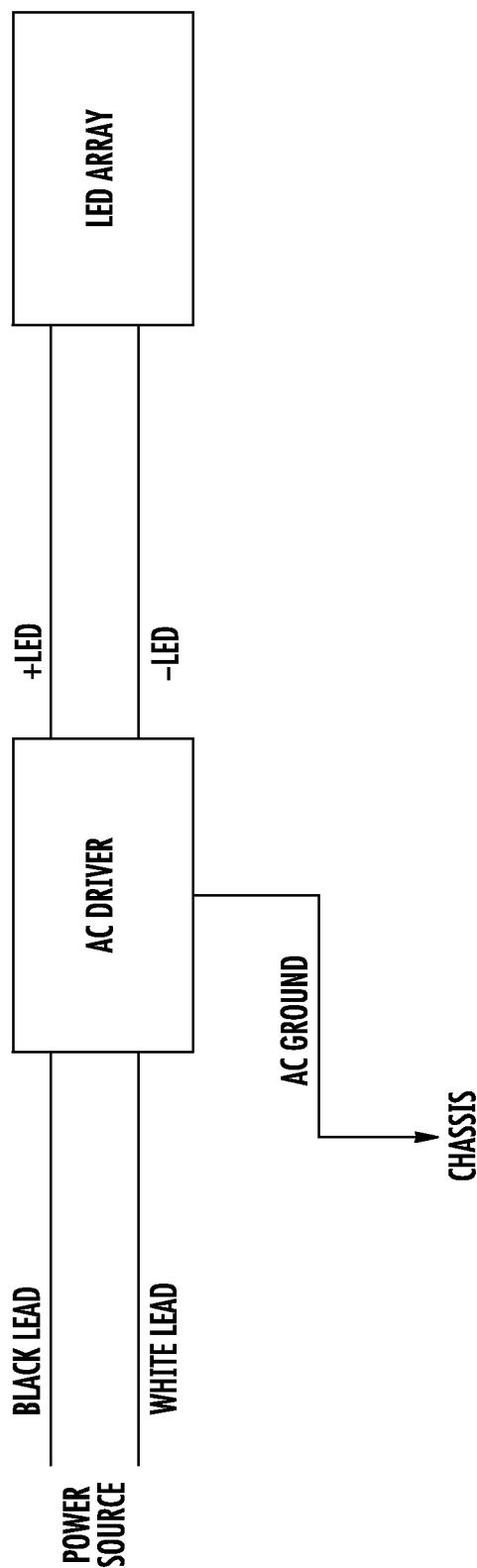
Figure 3:
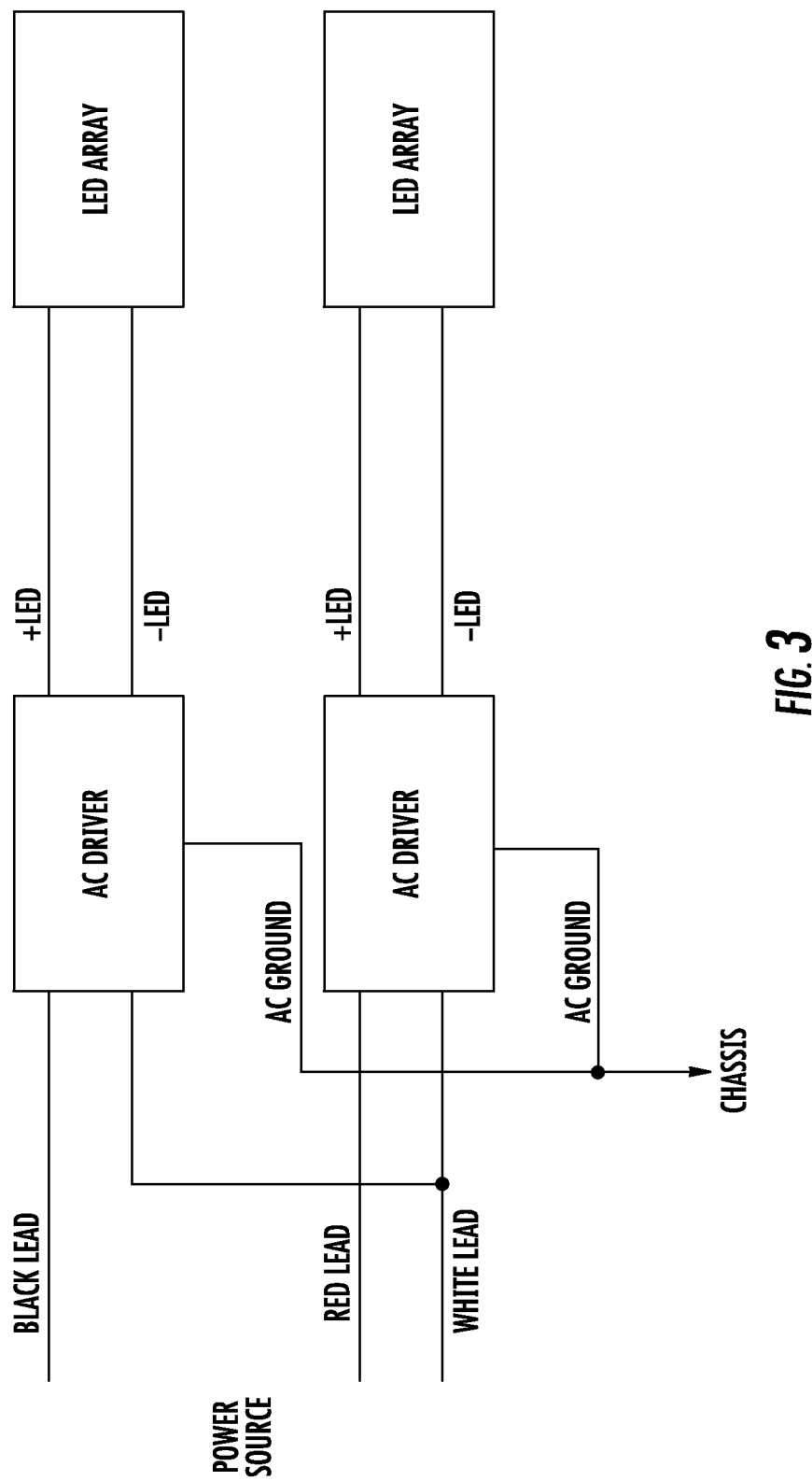
Figure 4:
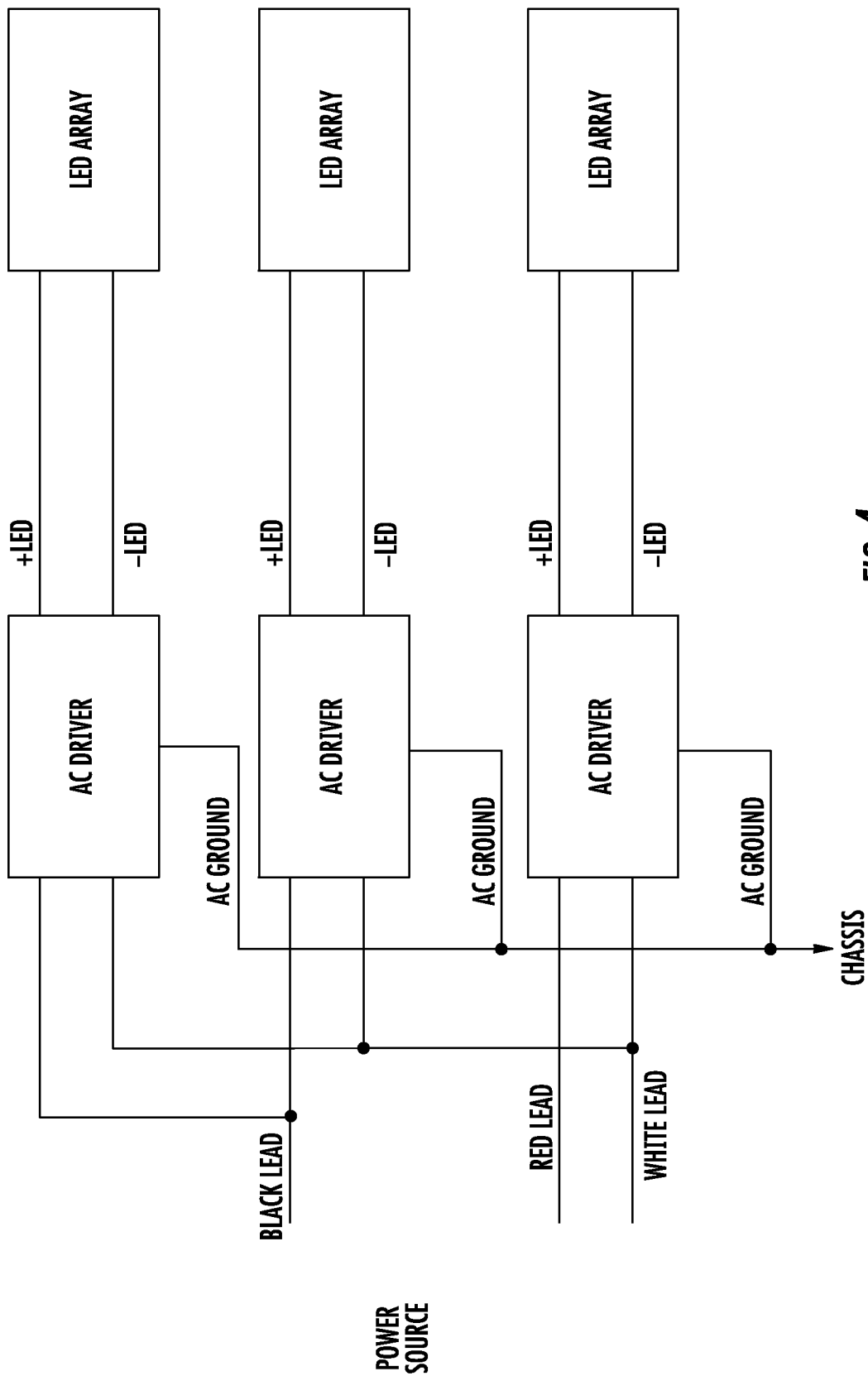
Figure 5:
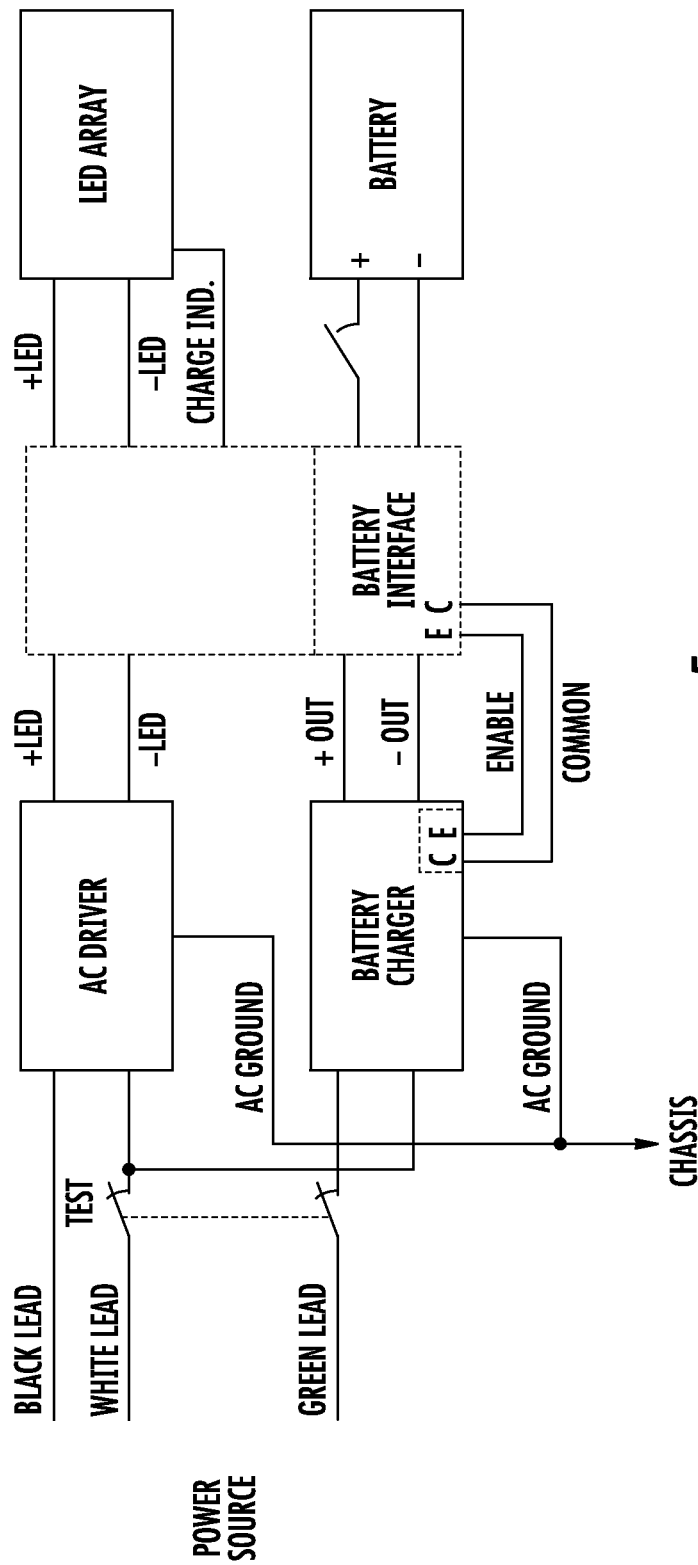
Figure 6:
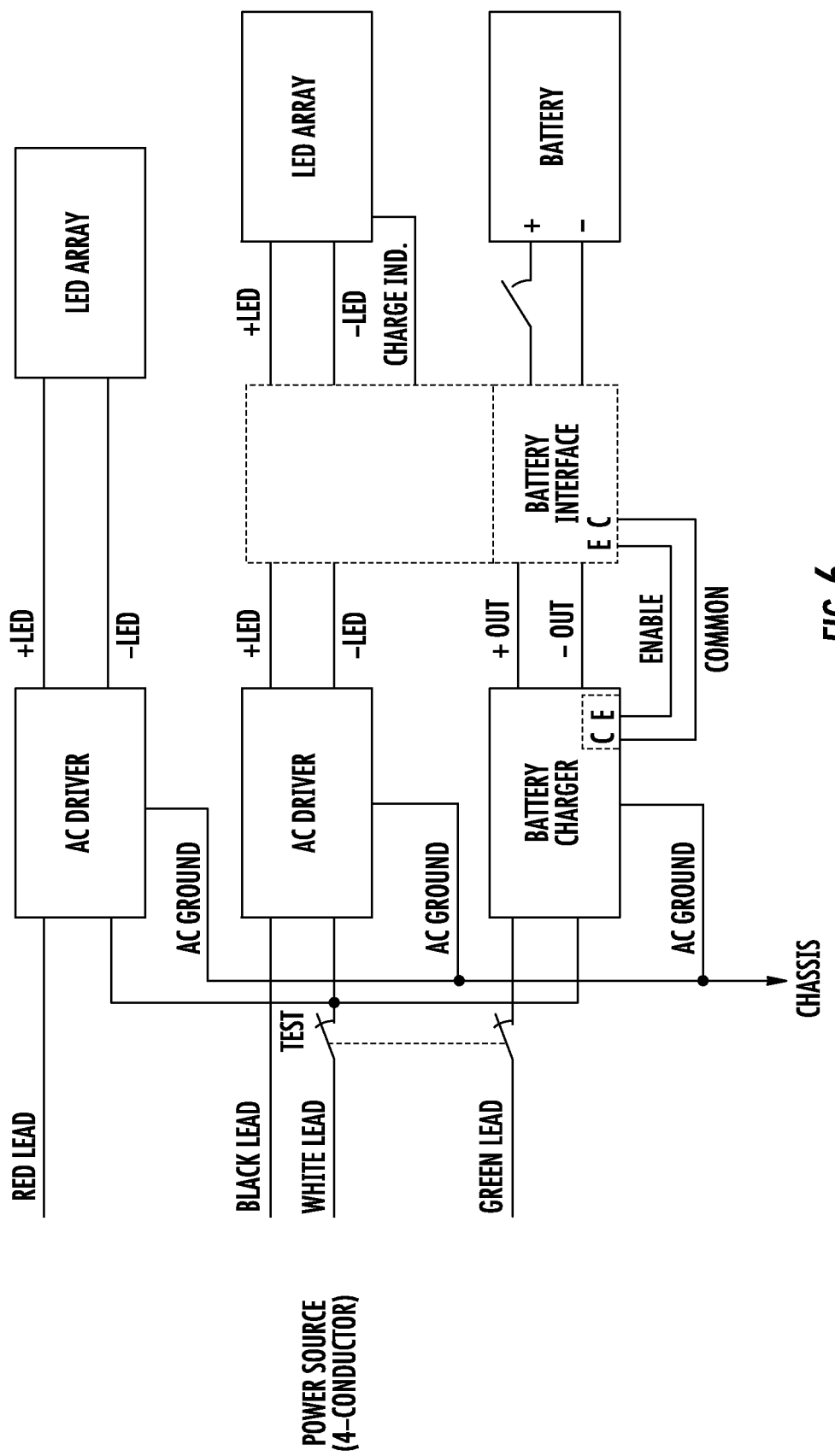
Figure 7:
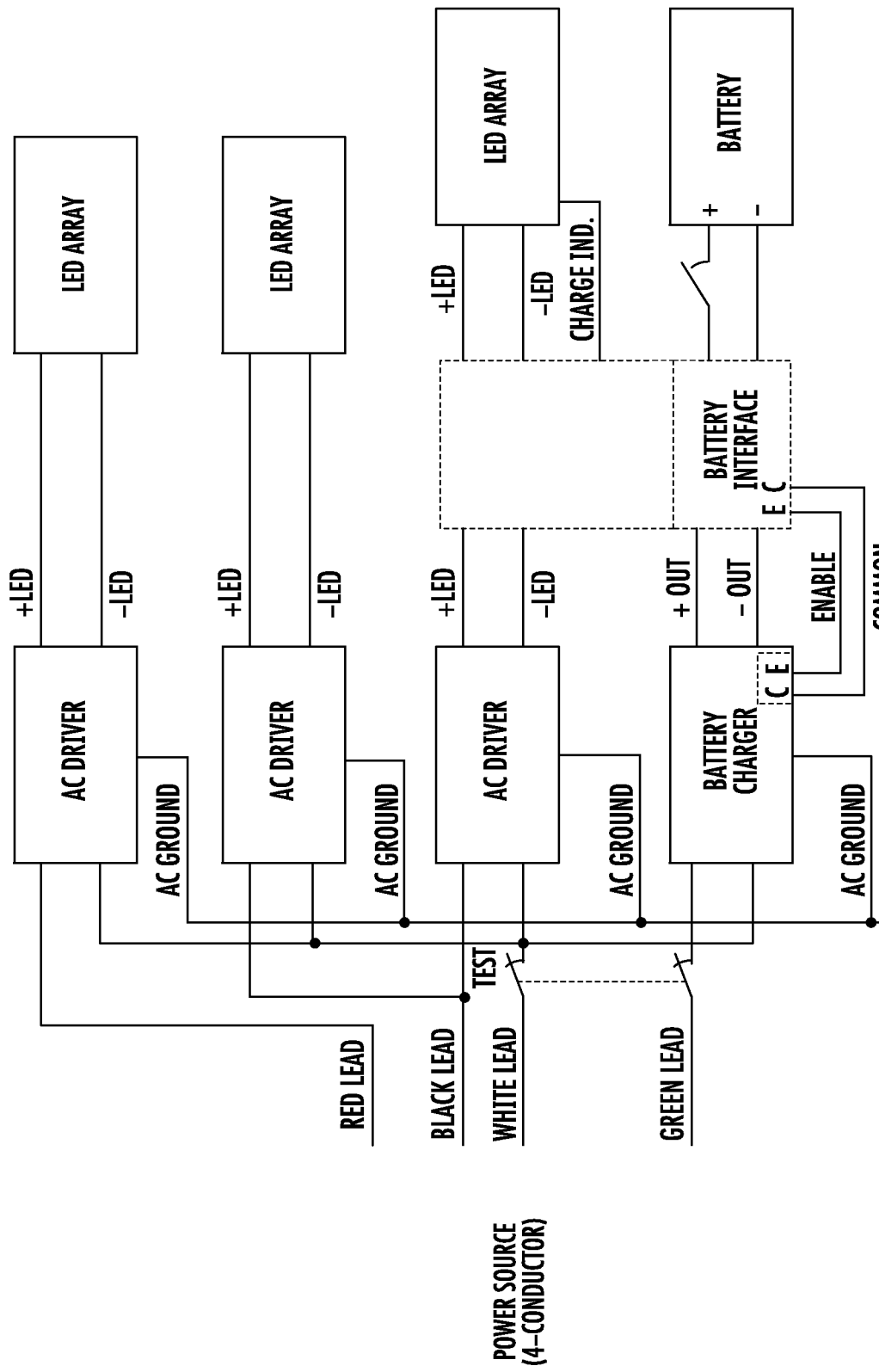
Figure 8:
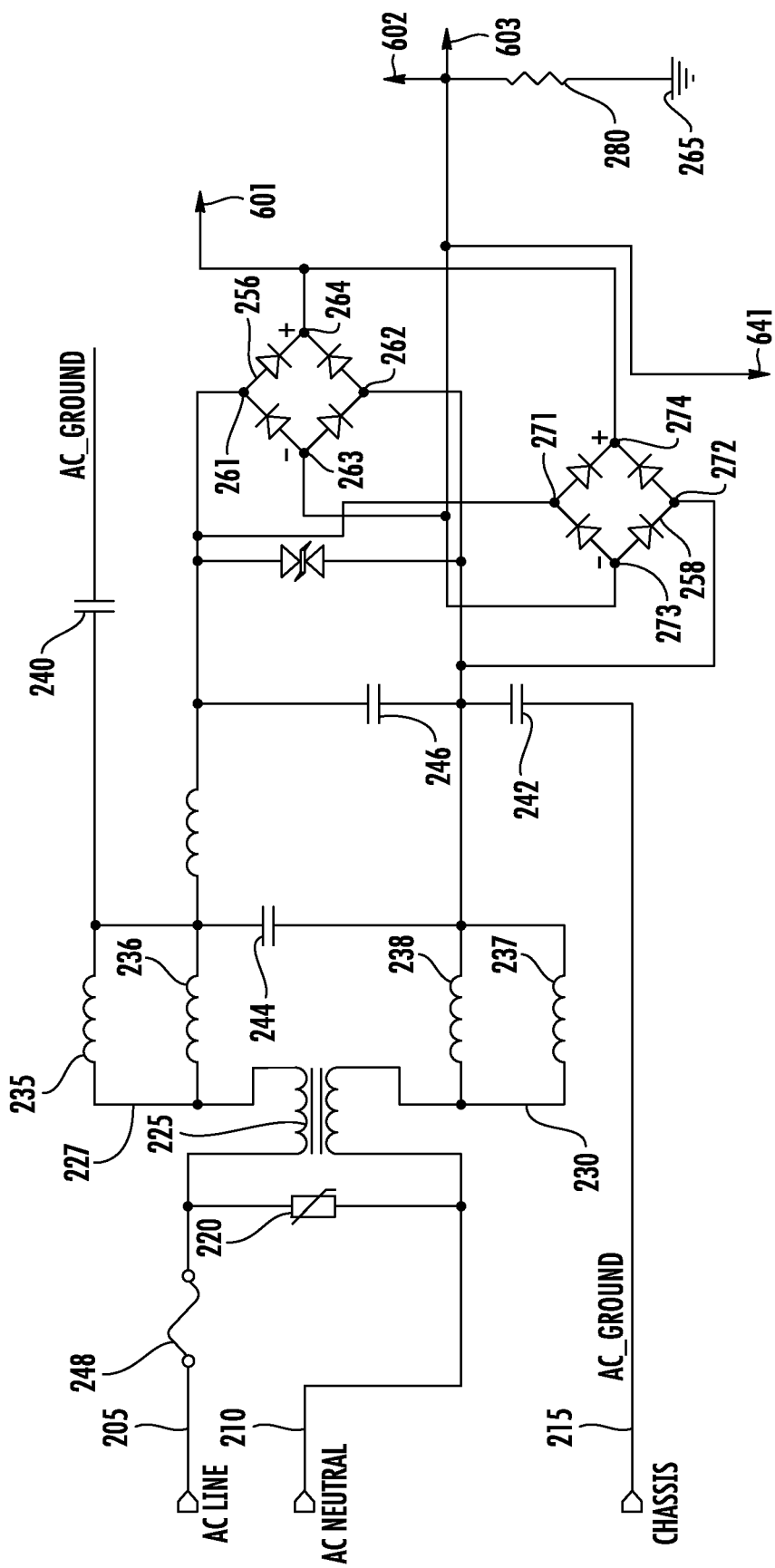
Figure 9:
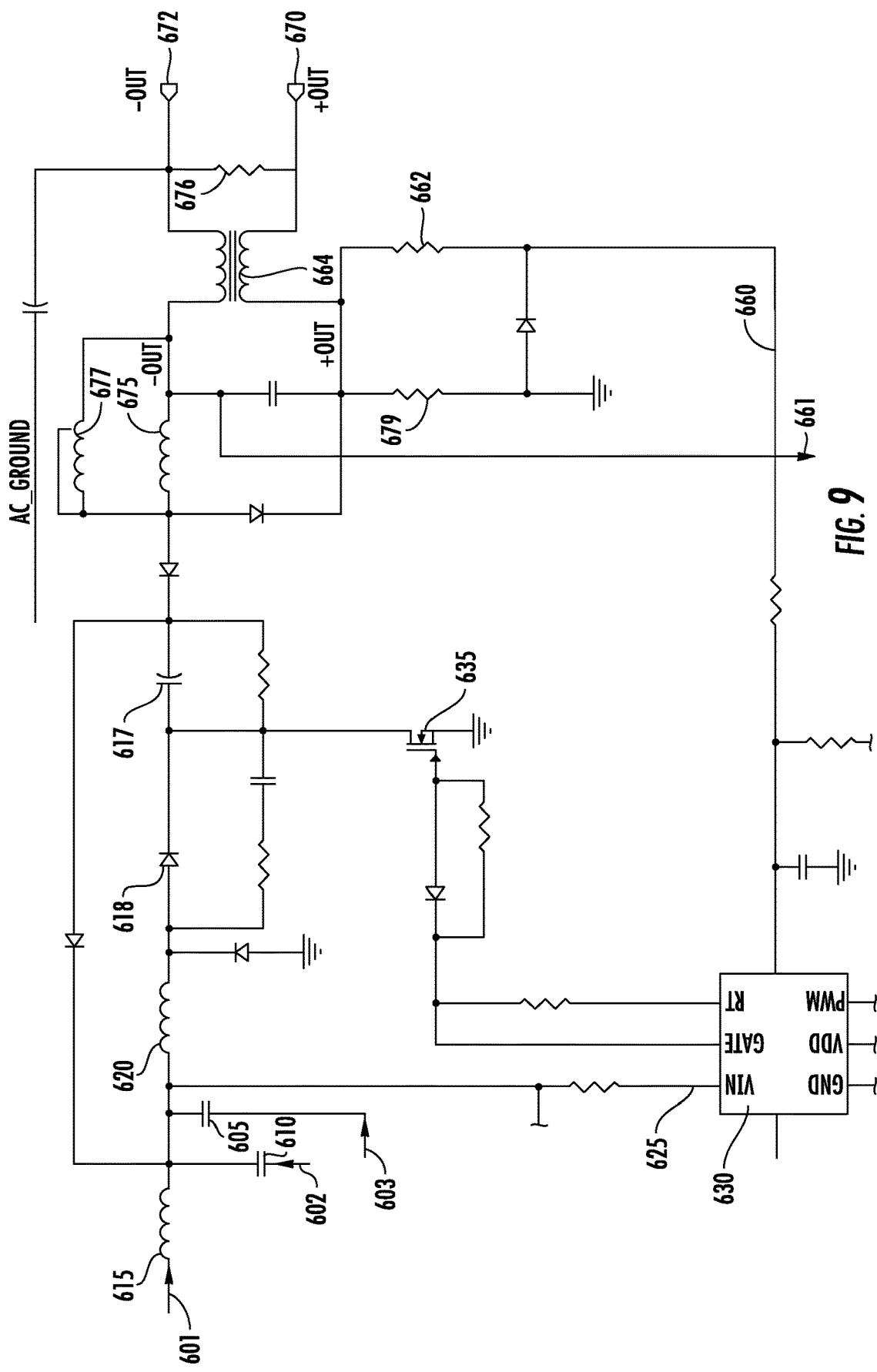
Figure 10:
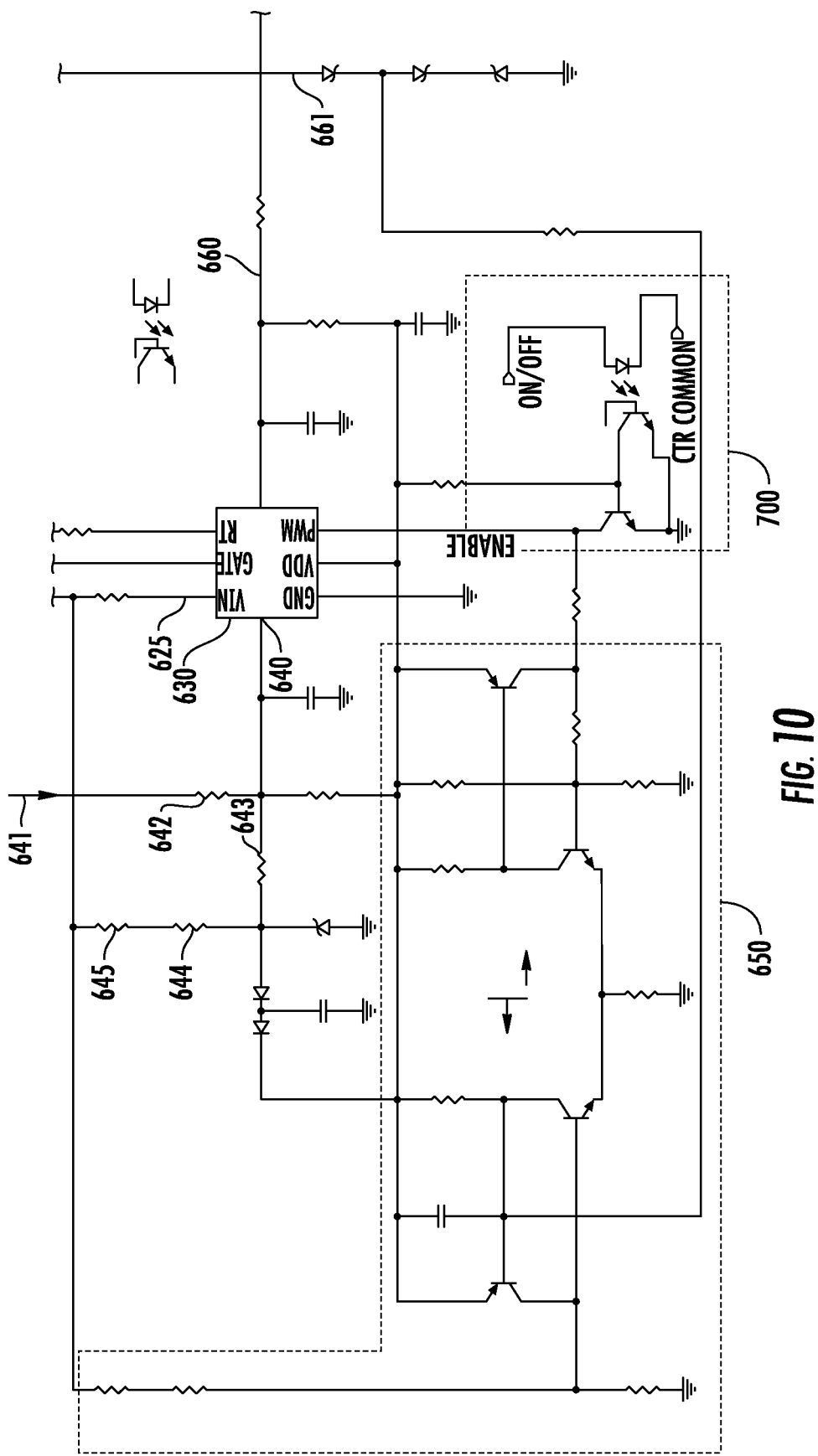

Having thus described the invention in general terms, reference will now be made to the accompanying drawings, which are not necessarily drawn to scale, and wherein:

FIG. 1 is a luminaire assembly including three LED arrays protected by lenses according to an example embodiment of the present invention;

FIG. 2 is a system diagram for a luminaire with a single LED array and a single AC Driver according to an example embodiment of the present invention;

FIG. 3 is a system diagram for a luminaire with two LED arrays and two AC Drivers according to an example embodiment of the present invention;

FIG. 4 is a system diagram for a luminaire with three LED arrays and three AC Drivers according to an example embodiment of the present invention;

FIG. 5 is a system diagram for a luminaire having a single LED array, single AC driver, and a battery backup according to an example embodiment of the present invention;

FIG. 6 is a system diagram for a luminaire having two LED arrays with two AC Drivers and a battery backup according to an example embodiment of the present invention;

FIG. 7 is a system diagram for a luminaire having three LED arrays with three AC Drivers and a battery backup according to an example embodiment of the present invention;

FIG. 8 is a circuit diagram for an input portion of the AC Driver circuit according to an example embodiment of the present invention;

FIG. 9 is a circuit diagram for a power portion and an output portion of the AC Driver circuit according to an example embodiment of the present invention; and FIG. 10 is a circuit diagram for a protection portion of the AC Driver circuit according to an example embodiment of the present invention.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Example embodiments of the present invention are generally described and depicted as embodied within a luminaire form factor; however, as will be apparent, embodiments of the present invention may be scalable and may be used in virtually any form factors, such as residential or commercial light fixtures, automotive applications, street lighting, among others. As such, the disclosure is intended to merely provide example embodiments and not to be limiting.

Light fixtures or luminaires according to example embodiments described herein provide a unique, energy-efficient LED light source for general illumination, particularly onboard ships, submarines, and other marine environments. Example embodiments provide an ergonomic streamlined appearance that may provide output substantially similar to or exceeding the light output of conventional florescent light fixtures that are commonly used in such environments. The incorporation of high-efficiency LEDs together with efficient thermal management provide a useful life that may exceed 400,000 hours. Further, substantial weight reduction is achieved relative to florescent light fixtures of similar output, while reducing hazardous waste and contaminants as LEDs do not have the mercury content of conventional florescent lamps.

Referring now to the example of FIG. 1, embodiments of the present invention may be implemented in a luminaire, such as luminaire 100 of FIG. 1. The luminaire 100 may include a main chassis 110, electronics housing 140, and mounting brackets 130, which may each be constructed from formed and polyester powder-coated 5052 marine-grade aluminum of various thicknesses. Further, the 5052 marine-grade aluminum may be heat treated, such as to the H32 temper standard for using 5052-H32 aluminum for the chassis 110 and mounting brackets 130, which has been found to be of higher durability relative to untampered aluminum. Paint masking may be appropriate in some areas for continuity purposes and ensuring electrical contact with the main chassis 110 and other components. According to the illustrated embodiment, LED arrays 120 may be electrically configured in parallel-series for white output, and single series with open-circuit protection devices in parallel with each LED (to meet LED failsafe requirement of MIL-SPEC MIL-DTL-16377 3.6.17 for color LEDs). According to some embodiments, white LEDs may be of a mid-power class, while color LEDs may be of a high power class. LEDs of red, blue, and cyan may be traditional band-gap LEDs while amber may be phosphor-converted to deliver superior output stability over temperature.

Embodiments described herein provide a luminaire 100 that is relatively light weight as compared to similar florescent luminaires while also providing a durable, long-lasting, and exceedingly rugged form factor. The materials selected for construction of the luminaire 100 render the luminaire rust and corrosion proof while also being substantially impervious to water intrusion. The light weight construction may replace or be used in place of luminaires that weigh 66% more than the disclosed luminaire while also having a useful life exceeding existing luminaires by 500%, lasting in excess of 300,000 hours versus conventional 50,000 hour luminaire life.

As shown in FIG. 1, the LED arrays may be protected from impact and physical damage with a lens, such as a polycarbonate lens that may be attached with VHB™ (very high bond) tape, for example. The LED drivers may be a constant-current design and may be encapsulated using a halogen-free, thermally-conductive polyurethane 2-part potting compound. Wiring within the electronics housing 140 to the LED arrays may use UL® ASWM 11028 halogen-free, 600-volt stranded hook-up wire, and may be connected using connectors, such as WAGO 734-series connectors with cage-clamp technology and locking fingers. Power distribution may be accomplished using WAGO 221-series cage-clamp connectors mounted on brackets using VHB™ tape. The LED driver modules may be individually shielded for electro-magnetic interference (EMI) compliance and use a common-mode filter between the driver and the LED array. Each pair of power leads may further include thereon a multi-turn toroidal ferrite core, and where possible, the power leads may be a twisted-pair for balanced power connections.

FIG. 2 illustrates a schematic representation of a wiring diagram for a single LED array. While the example embodiment of FIG. 1 includes three parallel arrays of LEDs, embodiments may include luminaires of different sizes providing different cumulative light (lumen) output. In an example luminaire having only a single LED array, the basic circuit diagram is shown in FIG. 2 with a power source feeding power to the AC driver, which is grounded to the chassis of the luminaire. The AC driver then, in turn, provides direct current to the LED array by way of the positive and negative LED leads shown.

FIG. 3 illustrates a schematic representation of a wiring diagram for a luminaire having two LED arrays. As shown, the white lead is the common lead for both AC drivers, while the black lead and the red lead each supply a respective AC driver with power. Both AC drivers are grounded to the chassis, and each LED array is powered by a separate AC driver. Similarly, FIG. 4 illustrates a schematic representation of a wiring diagram for a luminaire having three LED arrays. Two of the AC drivers share the black power lead, and each is grounded to the chassis. As with the embodiments of FIGS. 2 and 3, each LED array has its own AC driver. Each LED array is provided with a constant current signal from the AC driver. Current across an LED array is a function of temperature such that current is held constant rather than voltage, as applying constant voltage across the LED would cause an increase in current draw as the LED heats.

As shown in FIGS. 3 and 4, the AC Drivers and LED Arrays are arranged in parallel with each other. Generally speaking, such a configuration may introduce problems with powering the individual arrays. For example, such a configuration may typically result in crosstalk between the drivers, causing them to potentially deliver a different amount of current to their respective LED array than intended. Further, the LED arrays being in parallel across a large area of a luminaire assembly may introduce the possibility that one array may be out of current balance with the others if its temperature is different from the others. Still further, high power LEDs typically fail in a short-circuit rather than an open circuit. If an LED in one of the arrays fails in this manner, that array may then attempt to consume all of the current being delivered by the combined drivers, leading to catastrophic failure of the array which would eventually result in a loss of operation of all of the arrays. In the event of a single driver becoming non-operational, the theoretical loss in light output is nearly the same whether a fraction of the luminaire goes dark, or if the total LED current is reduced by the same fraction. In the case of the latter, considering the human eye cannot perceive a luminous difference that is less than 30%, paralleled arrays and drivers afford no derangement indication of a hardware issue. If the arrays are isolated and have their own driver, it becomes obvious when there is a need for repair should one driver or LED array become non-operational.

Some embodiments described herein may be equipped with a battery back-up system. FIG. 5 illustrates an example embodiment of a circuit for such an arrangement including a luminaire having a single LED array. As shown, the AC driver of FIG. 5 is arranged in a similar manner as that of FIG. 2. However, a battery charger, battery interface, and battery are coupled to the circuit. The battery charger receives AC power in the same manner as the AC driver, and produces a positive and negative DC output to the battery interface. The battery interface is in electrical communication with the AC Driver which controls the battery charging based on the power received at the AC Driver. Using the AC Driver to control the battery charging allows the AC Driver to select which power source is to be used to power the LED array based upon available AC power and available battery power, and also enables the AC Driver to charge the battery when sufficient power is available. In an instance in which a luminaire has multiple arrays, as shown in FIGS. 6 and 7, the battery interface is connected to the AC driver of the array closest to the test switch, while the other two AC Drivers and their respective arrays operate in parallel without interfacing with the battery charger.

Embodiments described herein provide a luminaire that complies with various military specifications for reliable operation on seafaring vessels. Two of those standards include MIL-STD-461 relating to electromagnetic compatibility and MIL-STD-1399, specifically MIL-STD-1399-300B, relating to shipboard power supplies. In order to accomplish this, the AC Driver circuits are uniquely configured to provide robust, reliable functionality while ensuring compliance with the aforementioned Military Specifications.

FIG. 7 illustrates a schematic for an input portion of the AC driving circuit. The input portion of the AC driving circuit is configured to absorb input transients and dissipate such transients and voltage spikes as heat. As shown, the input to the input portion includes an AC input line 205, an AC neutral line 210, and a chassis ground line 215. A varistor is positioned between the AC input line 205 and the AC neutral line 210 in order to protect against excessive transient voltages by shunting excess current from the excess voltage away from the input line to the neutral line. The AC input 205 and AC neutral 210 lines then feed common mode filter 225. The common mode filter blocks energy from escaping the circuit. The output of the common mode filter 225 is fed along two different paths (227 and 230), each to a pair of inductors in series. Each pair of inductors in the illustrated embodiment includes a 1 mH inductor 235, 237 and a 2.7 mH inductor 236, 238. The two different paths 227, 230 are provided for two duplicative footprints within the circuit for redundancy and reliability. The inductor pairs 235, 236 and 237, 238 are in parallel to absorb spikes in voltage and to dissipate the spikes in voltage as heat. The first path 227 from the transformer, through the parallel inductors 235, 236, is in electrical communication with a Class Y-capacitor 240 which is connected to chassis ground and which serves to protect against noise and interference, specifically electromagnetic interference (EMI) and radio-frequency interference (RFI). The Class Y capacitor 240, as it is between the transformer signal and chassis ground fails to an open state rather than to a short circuit. In the illustrated embodiment, Class Y capacitor 240 is rated at 0.022 uF (micro-Farad) at 304 VAC (Volts-AC) Similarly, the second path 230 from the transformer is connected to chassis ground through Class Y capacitor 242, which may be similarly rated to that of capacitor 240.

The first path 227 is isolated from the second path 230 by Class X capacitors 244 and 246. The Class X capacitors are connected across the line voltage and the neutral paths to isolate the respective paths against EMI and RFI through filtering. The Class X capacitors are designed to fail to a short circuit which would in-turn cause an overcurrent protection device, such as fuse 248, to open. The isolation between the path 227 and 230 blocks different modes of interference while improving the reliability of the input portion of the AC driver circuit. The first path continues with inductor 250 which is unpaired and which absorbs single-ended signal interference.

Along each of the first path 227 and the second path 230 are rectifiers 256 and 258. Rectifier 256 receives AC line input via the top-most terminal 261 with AC neutral input at the bottom-most terminal 262. The left-most terminal 263 is connected to ground 265 (as shown further below), while the right-most terminal 264 provides DC power output to the power section of the AC driver detailed in FIG. 8. Rectifier 258 similarly receives AC line input via the top-most terminal 271 with AC neutral input at the bottom-most terminal 272. The left-most terminal 273 is connected to ground 265 while the right-most terminal provides DC power output to the power section of the AC driver of FIG. 8. The resistor 280 between the rectifiers and ground 265 is selected to provide a current level setting by limiting input current to the power section of the AC driver.

The overall function of the components illustrated in FIG. 7 provide isolation of the power portion of the AC driver from EMI and RFI which may be prevalent in certain scenarios, such as onboard seafaring vessels having electrical micro-grids powered by onboard generators and various radar, sonar, and other electromagnetic components that produce potential interference.

FIG. 8. depicts a schematic of the power section of the AC driver circuit. As shown, the DC power from the rectifiers 256, 258 enters along 601 from FIG. 8, while Capacitors 605 and 610, which in the illustrated embodiment are each 0.1 micro-Farad and function as primary and alternative paths, are connected between the power line and ground through 602 and 603. The capacitors 605 and 610 are connected in parallel to filter noise from the circuit. The DC power received along 601 may pass through inductor 615 configured to choke or block AC while allowing DC to pass.

Inductor 615 of the illustrated embodiment is one milli-Henry (0.001 H). After inductor 615, the power signal from 601 is provided to the voltage-in pin 625 of an LED driver chip 630. A second inductor 620, of 270 uH (micro-Henry), is positioned past the capacitors 605 and 610, and is of a different inductance than that of 615 to provide distinct filtering of noise from the DC signal, operating together with polarized capacitor 617 to reduce the total harmonic distortion in the signal. The polarized capacitor 617 of the illustrated embodiment has a capacitance of 150 uF (micro-Farad) at 200 volts. Referring back to FIG. 7, resistor 280 is selected to set the current level entering the power portion of the AC driver circuit at 601. The resistor 280 of the illustrated embodiment provides a current set point to keep current in-rush low on power up of the circuit.

When the current coming from 601 through the inductors 615, 620 to switch 635 reaches the current limit defined by the resistor 280, the switch 635 opens and the current stops climbing. When the switch 635 opens, inductor 620 is charged until reaching its limit, at which point current passes through diode 618 to charge capacitor 617. When an LED is receiving power, the LED heats up, resulting in a higher impedance and drawing more current. Thus, current will rise as an LED heats up and the current limit switch 635 stops this climb. When the switch 635 is open, capacitor 617 is charged. Beyond the power portion of the AC driver of FIG. 8 described above, an output portion is also illustrated in FIG. 8 which will be described further below.

The LED driver chip 630 is supplied with the voltage in at 625 as shown in FIGS. 8 and 9, where voltage spikes are prevented by the input portion of the circuit shown in FIG. 7. Pin 640 of the LED driver chip 630 is the power return pin which is connected to the lowest potential in the circuit. This pin receives the reference for the regulated output voltage. The resistor network including resistors 642, 643, 644, and 645, receiving the power signal from 601 after passing through inductor 615, and connected to a neutral line through 641 (shown in FIG. 7), is selected to define the set point or voltage limit. According to the illustrated embodiment, the resistors include resistor 642 at 2.43 kΩ (kilo-ohms), 643 at 75 kΩ (kilo-ohms), 644 at 634 kΩ (kilo-ohms), and 645 also at 634 kΩ (kilo-ohms). Section 650 of the circuit of FIG. 9 functions as over-voltage and over-current protection to improve the reliability and life of the LEDs driven by the circuit. For example, in the event of a voltage spike of greater than 1,230 volts, the LED driver would be shut down to prevent damaging the LED.

The power to the LEDs is supplied from the LED driver chip 630 along line 660, which is illustrated primarily in FIG. 8 and which passes through resistor 662, rated at 100 Ωohms, before supplying the common mode filter or choke 664, through which the LED receives power via positive terminal 670 and negative terminal 672. The output portion of the circuit also includes an output inductor 675, shown here at one milli-Henry, which regulates the voltage across the LED, with inductor 677 operating on an alternate path with a different inductance. Resistor 679 measures current across the LED and controls fluctuation around the set point. Resistor 676, rated at 200 kΩ (kilo-ohms) in the illustrated embodiment, is provided across the positive terminal 670 and the negative terminal 672 to prevent "ghosting" of the LED, where the LED draws current from the circuit when power is removed from the input portion of the circuit.

Referring again to FIG. 9, section 700 of the circuit is optional, and is provided to charge a battery which is used in the event power to the AC driver circuit is lost. Embodiments described herein may include a battery for certain applications while omitting the battery for others.

FIG. 10 illustrates the protection portion of the circuit, with some of the components common with those of FIGS. 8 and 9 shown to correlate how the protection portion of the circuit is integrated with the input portion of FIG. 8 and the power portion of FIG. 9.

The AC driver circuit illustrated in FIGS. 7, 8, and 10, may be used to power LED arrays in various form factors in a manner that is robust and able to comply with various military specifications and standards required for implementation in harsh environments.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus for powering a light-emitting diode, comprising:
    a circuit board comprising an input portion, a power portion, a protection portion, and an output portion;
    the input portion of the circuit board comprising an alternating current line and a neutral line with a varistor positioned between the alternating current line and neutral line, the input portion further comprising a common mode filter,
    wherein the alternating current received across the alternating current line and neutral line is filtered through the common mode filter and whose output is used to supply two distinct, alternative paths,
    wherein each of the two distinct alternative paths comprise at least one capacitor, wherein the at least one capacitor on each of the two distinct alternative paths are arranged in parallel between the two distinct alternative paths to mitigate signal noise,
    wherein the input portion further comprises a pair of rectifiers that respectively receive alternating current line input from the two distinct alternative paths and alternating current neutral input from the two distinct alternative paths, and wherein the pair of rectifiers are electrically coupled to provide direct current power output;
    the power portion of the circuit board configured to receive the direct current power output provided by the pair of rectifiers to regulate current received from the two distinct, alternative paths, and to provide the direct current power output to an LED (Light-Emitting Diode) driver configured to drive an LED,
    wherein the pair of rectifiers comprises a first rectifier and a second rectifier, where in the first rectifier and the second rectifier are electrically coupled to the power portion of the circuit board,
    wherein the power portion of the circuit board is configured to limit current based on a value established by a resistor positioned between a negative output terminal of at least one of the first rectifier and the second rectifier and a chassis ground of the apparatus;
    the protection portion of the circuit board configured to mitigate voltage surges and to regulate voltage supplied to the LED driver; and the output portion configured to receive power through the LED driver and to supply the LED with constant-current power.

2. The apparatus of claim 1 wherein the first rectifier and the second rectifier are electrically coupled to the LED driver.

3. The apparatus of claim 1, wherein the protection portion of the circuit board is configured to limit voltage based on a value established by a plurality of resistors configured between direct current of the power portion of the circuit board and a chassis ground of the apparatus.

4. The apparatus of claim 1, wherein the output portion of the circuit board comprises a positive output terminal and a negative output terminal, wherein an LED array is configured to be connected across the positive output terminal and the negative output terminal.

5. The apparatus of claim 4, further comprising a resistor connected across the positive output terminal and the negative output terminal, wherein the resistor prevents ghosting of the LED when power is removed from the input portion of the circuit board.

6. The apparatus of claim 1, wherein the input portion, the power portion, the protection portion, and the output portion cooperate to comply with military standard specification 461G (MIL-STD-461G) relating to electromagnetic compatibility.

7. The apparatus of claim 1, wherein the input portion, the power portion, the protection portion, and the output portion cooperate to comply with military standard specification 1399-300B (MIL-STD-1399-300B) relating to shipboard power supplies.

8. A luminaire for use in harsh, corrosive environments comprising:
a main chassis;
at least one mounting bracket attached to the main chassis;
at least one Light-Emitting Diode (LED) array attached to the chassis;
at least one electronics housing attached to the chassis and comprising therein:
a circuit board comprising an input portion, a power portion, a protection portion, and an output portion;
the input portion of the circuit board comprising an alternating current line and a neutral line with a varistor positioned between the alternating current line and neutral line, the input portion further comprising a common mode filter, wherein the alternating current received across the alternating current line and neutral line is filtered through the common mode filter and whose output is used to supply two distinct, alternative paths,
wherein each of the two distinct alternative paths comprise at least one capacitor, wherein the at least one capacitor on each of the two distinct alternative paths are arranged in parallel between the two distinct alternative paths to mitigate signal noise,
wherein the input portion further comprises a pair of rectifiers that respectively receive alternating current line input from the two distinct alternative paths and alternating current neutral input from the two distinct alternative paths, and wherein the pair of rectifiers are electrically coupled to provide direct current power output;
the power portion of the circuit configured to receive the direct current power output provided by the pair of rectifiers to regulate current received from the two distinct, alternative paths, and to provide the direct current power output to an LED (Light-Emitting Diode) driver configured to drive the LED array,
wherein the pair of rectifiers comprises a first rectifier and a second rectifier, and wherein the first rectifier and the second rectifier are electrically coupled to the power portion of the circuit board,
wherein the power portion of the circuit board is configured to limit current based on a value established by a resistor positioned between a negative output terminal of at least one of the first rectifier and the second rectifier and a chassis ground of the luminaire;
the protection portion of the circuit configured to mitigate voltage surges and to regulate voltage supplied to the LED driver; and
the output portion configured to receive power through the LED driver and to supply the LED array with constant-current power.

9. The luminaire of claim 8 wherein the first rectifier and the second rectifier are electrically coupled to the LED driver.

10. The luminaire of claim 8, wherein the protection portion of the circuit board is configured to limit voltage based on a value established by a plurality of resistors configured between the direct current of the power portion of the circuit and a chassis ground of the luminaire.

11. The luminaire of claim 8, wherein the output portion of the circuit board comprises a positive output terminal and a negative output terminal, wherein an LED array is configured to be connected across the positive output terminal and the negative output terminal.

12. The luminaire of claim 11, further comprising a resistor connected across the positive output terminal and the negative output terminal, wherein the resistor prevents ghosting of the LED when power is removed from the input portion of the circuit board.

13. The luminaire of claim 8, wherein the input portion, the power portion, the protection portion, and the output portion cooperate to comply with military standard specification 461G (MIL-STD-461G) relating to electromagnetic compatibility.

14. The luminaire of claim 8, wherein the input portion, the power portion, the protection portion, and the output portion cooperate to comply with military standard specification 1399-300B (MIL-STD-1399-300B) relating to shipboard power supplies.

15. The apparatus of claim 1, further comprising a battery backup system coupled to the circuit board comprising a battery charger, battery interface, and battery.

16. The apparatus of claim 15, wherein the power portion of the circuit board is configured to control charging of the battery.

17. The apparatus of claim 15, wherein the power portion of the circuit board is configured to select between the input portion of the circuit board and the battery to supply the LED with power.

* * * * *